United States Patent [19]

Tabuchi

[11] 4,440,841

[45] Apr. 3, 1984

[54] PHOTOMASK AND PHOTOMASK BLANK

[75] Inventor: Kazuhiro Tabuchi, Tsurugashima, Japan

[73] Assignee: Dai Nippon Insatsu Kabushiki Kaisha, Japan

[21] Appl. No.: 318,201

[22] Filed: Nov. 4, 1981

[30] Foreign Application Priority Data

Feb. 28, 1981 [JP] Japan ................................ 56-28721
Feb. 28, 1981 [JP] Japan ................................ 56-28722
May 7, 1981 [JP] Japan ................................ 56-68693
May 7, 1981 [JP] Japan ................................ 56-68694

[51] Int. Cl.$^3$ .............................................. G03F 9/00
[52] U.S. Cl. .................................. 430/5; 430/11;
430/14; 156/652; 156/656; 428/209; 428/469;
428/472
[58] Field of Search ............... 430/4, 5, 9, 11, 14,
430/16; 156/652, 656; 428/209, 469, 472

[56] References Cited

U.S. PATENT DOCUMENTS

| T954,002 | 1/1977 | Castrucci et al. ................. 430/5 |
| 4,166,148 | 8/1978 | Sakurai ............................ 428/332 |
| 4,178,403 | 12/1979 | Sakurai et al. .................... 428/209 |
| 4,374,912 | 2/1983 | Kaneki et al. ..................... 430/5 |
| 4,396,683 | 8/1983 | Hatano et al. ..................... 428/469 |

FOREIGN PATENT DOCUMENTS 5579447 12/1978 Japan .
54-51832 4/1979 Japan .
56-107245 8/1981 Japan .

Primary Examiner—John E. Kittle
Assistant Examiner—José G. Dees
Attorney, Agent, or Firm—Parkhurst & Oliff

[57] ABSTRACT

In a photomask (hard mask) blank having a masking film of metallic chromium, chromium oxide, or the like, formed on a transparent substrate, there are interposed between the transparent substrate and the masking film a translucent and electroconductive film made of molybdenum, tantalum or the like and a translucent and chemically resistant protective film made of aluminum oxide, silicon oxide or the like, in the order mentioned from the side of the transparent substrate. The photomask obtained from this photomask blank is free from distortions or defects of transfer patterns caused by generation of electrostatic charges and also exhibits excellent durability in repeated uses, with intermediate repeated chemical washing.

10 Claims, 5 Drawing Figures

PHOTOMASK AND PHOTOMASK BLANK

BACKGROUND OF THE INVENTION

This invention relates generally to photomasks and photomask blanks for use in the production of semiconductors, integrated circuits (IC), large-scale integrated circuits (LSI), and like electronic components. More specifically, this invention relates to photomasks of the type generally called hard masks and to their blanks.

In general, a photomask blank is fabricated by forming on an outer surface of a transparent substrate a film of a masking material such as a metal or a material usable instead thereof by a process such as vacuum evaporation or sputtering. By applying a photolithographic process including the steps of forming a photoresist film, pattern exposure to light, and etching to this photomask blank, a thin film of the above mentioned metal or another masking material is left in the form of a pattern such as a pattern of a circuit for an IC or an LSI on the transparent substrate thereby to produce a photomask.

As photomasks known in the art, there have been used so-called hard masks having excellent durability, including chromium masks, low-reflection chromium masks, both-side low-reflection chromium masks, chromium oxide masks, silicon masks, iron oxide masks, and others, as well as emulsion masks using silver emulsion films. More recently, electroconductive masks having electroconductivity even after patternization of masking films thereof are beginning to be used. These electroconductive masks have the advantages of decreased occurrence of pattern deficiencies or deflects caused by charging-discharging of electrostatic charges as well as decreased adherence of dust caused by electrostatic charges; of having the capability of being exposed to an electron beam even when the masking film is non-electroconductive; and also of being utilizable for measurement of dimensions or evaluation of registration of masks by an electron beam system.

However, most of these electroconductive thin films generally have weak resistance to chemicals, and therefore, when washed repeatedly with an acid or an alkali conventionally used for washing of masks, the electroconductive portions will be destroyed. As a result, not only is their function as electroconductive masks lost, but also the film for masking is also destroyed together with the electroconductive film, whereby their function as photomasks is also disadvantageously lost. Further, such an electroconductive film generally has inadequate surface hardness. Consequently, in spite of the use of a hard mask with a high surface hardness, the strength and durability of the entire mask are determined by those of the conductive film, whereby the durability of a photomask to be used particularly for contact printing is poor.

Still another difficultly is that even an electroconductive film, which is itself resistant to chemicals, may sometimes lose its resistance to certain chemicals at the portion at which the electroconductive film is directly contacting the masking film.

SUMMARY OF THE INVENTION

An object of the present invention is to provide a photomask, having sufficient electroconductivity to prevent silicon wafer elements from being destroyed by electrostatic charges at the time of pattern printing and occurrence of pattern defects of the photomask and being also capable of dimensional measurement as well as evaluation of registration by an electron-beam system and a blank thereof.

Another object of the present invention is to provide a photomask having durability, including the capability of being washed repeatedly with a strong chemical during use and a blank thereof.

Still another object of the present invention is to provide a photomask blank which can be fabricated into a photomask according to a method including the step of dry etching.

According to my investigation, it has now been found that in forming successively an electroconductive thin film and a masking thin film made from specific materials, respectively, on a transparent substrate, it is very effective to interpose a chemically resistant protective film made from a specific material between the two thin films.

Thus, a characteristic feature of the photomask blank according to the present invention resides in a structure comprising an electroconductive thin film having transparency made of a material selected from Mo, Ta, Nb, Ti, Cr, V, W, Zr, $In_2O_3$ and $SnO_2$; a chemically resistant protective film having transparency made of a material selected from aluminum oxide, calcium oxide, magnesium oxide, silicon oxide, silicon nitride, cerium oxide, titanium oxide, tantalum oxide and chromium oxide; a masking film comprising at least one layer of a masking material selected from chromium, chromium oxide, chromium nitride, silicon, silicon oxide, tantalum, tantalum nitride, tantalum oxide, iron oxide and combinations of these materials; and a transparent substrate on which the three films are successively laminated.

The photomask according to the present invention is obtained by patternization of the masking film in the above photomask blank.

The nature, utility, and further features of this invention will be more clearly apparent from the following detailed description, beginning with a consideration of general aspects of the invention and concluding with specific examples of practice thereof, when read in conjunction with the accompanying drawings, briefly described below.

DETAILED DESCRIPTION OF THE INVENTION

Figure 1:
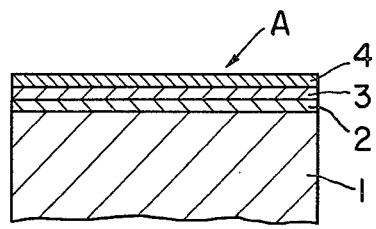
FIGS. 1 and 5 are schematic sectional views, respectively showing laminated structures of one example of a photomask blank according to this invention and one example of a photomask prepared from that photomask blank.

As shown in FIG. 1, a photomask blank A according to the present invention has an electroconductive film 2 having transparency, a chemically-resistant protective film 3 having transparency, and a masking film 4 laminated successively on a transparent substrate 1.

The transparent substrate 1 in the photomask blank A of this invention is made of any optically transparent material such as, for example, soda-lime glass, quartz glass, or sapphire. While there are essentially no limits to the thickness of this substrate, substrates of thicknesses of 0.2 to 6 mm are ordinarily used.

The electroconductive film 2 having transparency may be prepared of one or a mixture of two or more materials selected from molybdenum, tantalum, niobium, titanium, chromium, vanadium, tungsten, zirconium, indium oxide and tin oxide. As such a film, a film having a transmittance of 60 percent or more with respect to light of a wavelength of 400 to 600 nm and having a resistivity of the film in terms of sheet resistivity of below 10 K$\Omega$ per square is desirable. Further, the thickness of this film 2 is preferably 10 to 1000 Å.

The chemically resistant protective film 3 having transparency is made of one or a mixture of two or more materials selected from aluminum oxide, calcium oxide, magnesium oxide, silicon oxide, silicon nitride, cerium oxide, tantalum oxide, chromium oxide and titanium oxide. Among these, as a single material, silicon oxide is the most preferable. This film has a transmittance desirably of 80 percent or more with respect to light of a wavelength of 200 to 600 nm, particularly 400 to 600 nm. This film is highly resistant to chemicals and protects the aforesaid electroconductive film, thus functioning to prevent the electroconductive film from being destroyed by repeated washing treatment with acids or alkalis. This film also functions as a barrier, by which the masking film can be effectively prevented from deleterious effects due to sodium ions precipitated from a transparent substrate such as that of glass. Further, this film has a chemical resistance with respect to an etching solution or an etching gas employed or etching of a masking film to be provided on the film. The thickness of this film is preferably 10 to 1000 Å, particularly 50 to 100 521 . With a thickness within such a range, surface electroconductivity can be retained after formation of the protective film 3.

Considering now the masking film 4, it can be made of one or a mixture of two or more materials selected from chromium, chromium oxide, chromium nitride, silicon, silicon oxide, tantalum, tantalum nitride, tantalum oxide and iron oxide. This film may also itself be a laminated product having a low reflection film such as one of chromium oxide laminated on an outer surface of chromium. The thickness of the masking film 4 is, for example, 300 to 2000 Å.

Figure 5:
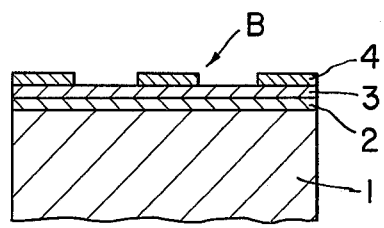
Figure 2:
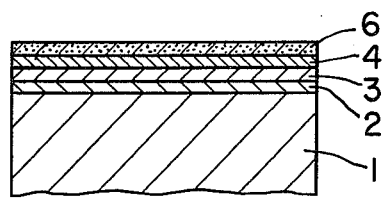
FIGS. 2, 3 and 4 are schematic sectional views illustrating the steps for preparation of a photomask from a photomask blank.
Figure 3:
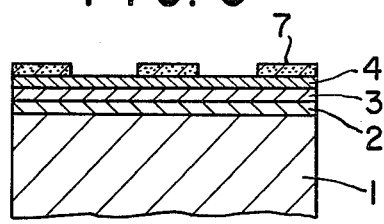
Figure 4:
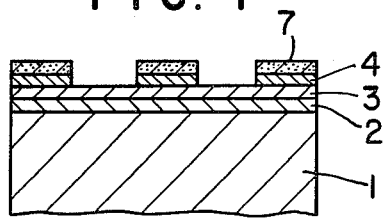

FIGS. 2 through 5 indicate the steps for production of a photomask of this invention with the use of a photomask blank of this invention. As shown in FIG. 2, a resist 6 is coated on the masking film 4. Then, exposure to light and developement are carried out to form a resist pattern 7 as shown in FIG. 3. This step is followed by etching of the exposed masking film portions as shown in FIG. 4. Finally, as shown in FIG. 5, the resist is peeled off to obtain a desired photomask B.

The etching of the masking film may be conducted by either the wet etching method or the dry etching method.

In the case of wet etching, it is possible to use an etchant which will etch the masking film without erosion of the chemically resistant protective film. Some examples of such an etchant are as follows.

Composition of etchant when the masking film is Cr or $Cr_2O_3$ $(NH_4)_2Ce(NO_3)_4$: 165.0 g
$HClO_4$(70%): 43.0 ml
Pure water: 1000 ml Composition of etchant when the masking film is Si $AgNO_3$: 1.0 g
$NH_4F$: 0.5 g
$HNO_3$: 100 ml
Pure water: 100 ml Composition of etchant when the masking film is $Fe_2O_3$ HCl: 300 ml
Pure water: 100 ml Next, in the case of dry etching, it can be conducted by means of a parallel-plate type plasma-etching device under the conditions corresponding to the masking film as specified below.

Conditions when the masking film is Cr or $Cr_2O_3$

Etching gas: mixture of $CCl_4$ and air
Gas pressure: 0.3 Torr
High-frequency power applied: 200 W
Etching time: 5 minutes Conditions when the masking film is Si Etching gas: $CF_4$
Gas pressure: 0.02 Torr
High-frequency power applied: 250 W
Etching time: 1 minute Conditions when the masking film is Ta or $Ta_2O_3$ Etching gas: $CF_4$
Gas pressure: 0.01 Torr
High frequency power applied: 300 W
Etching time: 2 minutes The photomask obtained according to the procedure as described above has an electroconductive film and therefore has ample electroconductivity to avoid destruction of the silicon wafer elements and occurrence of pattern defects in the photomask caused by electrostatic charges at the time of pattern printing.

The electroconductive film, which is protected on its outer surface by a chemically resistant protective film, can be subjected repeatedly to washing treatment with acids or alkalis without being impaired thereby.

Further, dimensional measurement by an electron-beam system and evaluation of registration of the photomask of this invention are possible.

As described in detail above, the photomask blank of this invention can produce a photomask having ample electroconductivity to prevent destruction of silicon wafer elements and occurrence of pattern defects of the photomask caused by electrostatic charges at the time of pattern printing, being also highly resistant to chemicals, for which dimensional measurement and evaluation of registration by an electron-beam system are possible.

Further, with use of the photomask blank according to this invention, a photomask can be prepared not only by a wet etching system but also by a dry etching system.

In order to indicate more fully the nature and utility of this invention, the following examples are set forth, it being understood that these examples are presented as illustrative only and are not intended to limit the scope of the invention.

EXAMPLE 1

On a glass plate, a film of tantalum was formed to a thickness of 50 Å according to the electron-beam heated vacuum evaporation method, and then a film of silicon oxide was formed to a thickness of 200 Å according to the electron-beam heated vacuum evaporation method. Further, on the silicon oxide film, a chromium film was formed to a thickness of 1,000 Å according to the electron-beam heated vacuum evaporation method to produce a photomask blank of this invention.

On the chromium film of the blank as prepared above, a resist (AZ-1350, produced by Shipley Co.) was coated, and then a resist pattern was formed thereon by exposure to light and then developing of the resist. Thereafter, with the use of an etchant having the composition shown below, etching was carried out at a liquid temperature of 20° C. for 40 seconds to remove the exposed chromium film portions by etching to give a desired photomask.

Composition of Etchant $(NH_4)_2Ce(NO_3)_6$: 165.0 g
$HClO_4(70\%)$: 43.0 ml
Pure water: 1,000 ml The following durability tests were conducted on ten sheets of the thus prepared photomask.

The test for chemical resistance was carried out by immersing the photomask in a mixture of conc. sulfuric acid with 20 vol.% of a hydrogen peroxide (30%) aqueous solution under heating at 110° C. As a result, no failure occurred in the electroconductive film with no change whatsoever in electroconductivity.

The test with respect to electrostatic charges was carried out by repeating 100 times pattern transfer onto photomask blanks having silver emulsion coatings in an atmosphere at 22° C. at a humidity of 40%. No failure occurred in the photomask.

EXAMPLE 2

On a glass plate, film of tantalum was formed to a thickness of 50 Å according to the electron-beam heated vacuum evaporation method, and then a film of silicon oxide was formed to a thickness of 200 Å according to the same deposition method. Further, on the silicon oxide film, a silicon film was formed to a thickness of 1,000 Å according to the same deposition method to produce a photomask blank of this invention.

On the silicon film of the blank as prepared above, an electron-beam resist (COP, produced by Mead Chemical Co.) was coated. This step was followed by exposure to an electron beam and development of the image formed to form a resist pattern. Thereafter, with the use of an etchant having the composition shown below, etching was carried out at a liquid temperature of 20° C. for 2 minutes to remove the exposed silicon film portions to obtain a desired photomask.

Composition of Etchant $AgNO_3$: 1.0 g
$NH_4F$: 0.5 g
$HNO_3$: 100 ml
Pure water: 100 ml The chemical resistance test and the test with respect to electrostatic charges were conducted similarly as described in Example 1 for ten sheets of the thus prepared photomask.

As a result of the chemical resistance test, no defect was found to occur in the electroconductive film and there was observed no change in electroconductivity. No defect caused by electrostatic charges was observed, either.

For the photomask as prepared above, it was also possible to effect the registration of the mask with the use of an electron beam with good precision.

EXAMPLE 3

A part of the chromium film in the photomask blank as prepared in Example 1 was removed by the dry etching method under the etching conditions shown below to produce a desired photomask.

Etching Conditions

Etching gas: mixture of $CCl_4$ and air
Gas pressure: 0.3 Torr
High-frequency power applied: 200 W
Etching time: 5 minutes

EXAMPLE 4

On a glass plate, a film of chromium was formed to a thickness of 50 Å according to the electron-beam heated vacuum evaporation method, and then a film of silicon oxide was formed to a thickness of 200 Å according to the same method. Further, a tantalum film was formed on the silicon oxide film to a thickness of 1,000 Å according to the electron-beam heated vacuum evaporation method to obtain a desired photomask blank.

A part of the tantalum film in the blank as prepared above was removed by etching according to the dry etching method under the following etching conditions to obtain a desired photomask.

Etching Conditions

Etching gas: $CF_4$
Gas pressure: 0.01 Torr
High-frequency power applied: 300 W
Etching time: 2 minutes

EXAMPLE 5

A part of the silicon film in the photomask blank as prepared in Example 2 was removed by etching according to the dry etching method under the following etching conditions to obtain a desired photomask.

Etching Conditions

Etching gas: $CCl_4$
Gas pressure: 0.02 Torr
High-frequency power applied: 250 W
Etching time: one minute

EXAMPLE 6

On a glass plate, a chromium film was formed to a thickness of 50 Å according to the electron-beam heated vacuum evaporation method, and then a film of silicon oxide was formed thereon to a thickness of 200 Å according to the same method. Further, on the silicon oxide film, a silicon film was formed to a thickness of 1000 Å to obtain a photomask blank.

Following the procedures as described in Example 2, a part of the silicon film in the blank as prepared above was removed by etching to produce a desired photomask.

EXAMPLE 7

A part of the silicon film in the blank as prepared in Example 6 was removed by etching according to the dry etching method under the following conditions.

Etching Conditions

Etching gas: $CCl_4$
Gas pressure: 0.02 Torr
High-frequency power applied: 250 W
Etching time: 1 minute With the use of ten sheets for each of the photomasks as prepared in Examples 3 to 7, the chemical resistance test and the test with respect to electrostatic charges were conducted similarly as described in Example 1. As a result of the chemical resistance tests, no defect was found to have developed in any of the photomasks, without change in electroconductivity. Further, no defect was observed to be caused by electrostatic charges.

I claim:

1. A photomask blank comprising a transparent substrate, a transparent electroconductive film having a thickness between 10 and 1,000 Å comprising a material selected from the group consisting of molybdenum, tantalum, niobium, titanium, chromium, vanadium, tungsten, zirconium, indium oxide and tin oxide, a transparent chemically resistant protective film comprising a material selected from the group consisting of aluminum oxide, calcium oxide, magnesium oxide, silicon oxide, silicon nitride, cerium oxide, titanium oxide, tantalum oxide and chromium oxide and a masking film comprising at least one layer of a masking material selected from the group consisting of chromium, chromium oxide, chromium nitride, silicon, silicon oxide, tantalum, tantalum nitride, tantalum oxide, iron oxide and combinations thereof, said three films being laminated successively on said transparent substrate, said protective film and said masking film selected so that they are different materials and so that the protective film is chemically resistant to an etchant suitable for etching the masking film.

2. A photomask in accordance with claim 1, wherein the conductive film has a transmittance greater than or equal to 60% with respect to light of a wavelength of 400 to 600 nm, a sheet resistivity of less than 10K ohms per square and a thickness between 10 and 1,000 Å.

3. A photomask in accordance with claim 1, wherein the chemically resistant protective film has a thickness between 10 and 1,000 Å and a transmittance of 80% or more with respect to light of a wavelength between 400 to 600 nm.

4. A photomask in accordance with claim 1, wherein the chemically resistant protective film comprises silicon oxide.

5. A photomask comprising a transparent substrate, an electroconductive film having a thickness between 10 and 1,000 Å comprising a material selected from the group consisting of molybdenum, tantalum, niobium, titanium, chromium, vanadium, tungsten, zirconium, diindium trioxide and stannic oxide, a transparent chemically resistant protective film comprising a material selected from the group consisting of aluminum oxide, calcium oxide, magnesium, oxide, silicon oxide, silicon nitride, cerium oxide, titanium oxide, tantalum oxide and chromium oxide, said electroconductive film and said protective film being successively laminated on said transparent substrate, a mask pattern of a masking film comprising at least one layer of a masking material selected from the group consisting of chromium, chromium oxide, chromium nitride, silicon, silicon oxide, tantalum, tantalum nitride, tantalum oxide, iron oxide and combinations thereof provided on said chemically resistant protective film, said protective film and said masking film selected so that they are different materials and so that the protective film is chemically resistant to an etchant suitable for etching the masking film.

6. A photomask in accordance with claim 5, wherein the electroconductive film has a transmittance greater than or equal to 60% with respect to light of a wavelength of 400 to 600 nm, a sheet resistivity of less than 10K ohms per square and a thickness of 10 to 1,000 Å.

7. A photomask in accordance with claim 5, wherein the chemically resistant protective film has a thickness between 10 to 1,000 Å and a transmittance greater than or equal to 80% with respect to light of a wavelength of 400 to 600 nm.

8. A photomask in accordance with claim 5, wherein the chemically resistant protective film is comprised of silicon oxide.

9. A photomask in accordance with claim 5, wherein said masking film has been patternized according to the wet etching method.

10. A photomask in accorance with claim 5, wherein said masking film has been patternized according to the dry etching method.

* * * * *